United States Patent [19]

Charles

[11] 4,403,185
[45] Sep. 6, 1983

[54] PROCESS AND DEVICE FOR DETECTING FREQUENCY VARIATIONS

[75] Inventor: Donald E. Charles, Lake Zurich, IL

[73] Assignee: Baxter Travenol Laboratories, Inc., Deerfield, Ill.

[21] Appl. No.: 386,719

[22] Filed: Jun. 9, 1982.

[51] Int. Cl.³ .......................................... G01R 23/02
[52] U.S. Cl. ............................... 324/78 D; 307/514; 328/141; 324/83 D
[58] Field of Search ............... 324/78 D, 79 D, 83 D, 324/140 R; 307/514, 516, 522, 526–528, 273; 328/133, 134, 141, 207; 330/151

[56] References Cited

U.S. PATENT DOCUMENTS

| | | | |
|---|---|---|---|
| 3,588,710 | 6/1971 | Masters | 307/514 |
| 3,753,130 | 8/1973 | Pezzutti | 328/141 |
| 4,119,910 | 10/1978 | Hayashi | 324/83 D |
| 4,333,055 | 6/1982 | Crackel | 307/514 |

*Primary Examiner*—Michael J. Tokar
*Attorney, Agent, or Firm*—Paul C. Flattery; George H. Gerstman; Robert A. Benziger

[57] ABSTRACT

A process and device are provided for detecting frequency variations of waveforms (10). The waveform (10) is sensed and a first signal (16) is provided with each occurrence of the sensed waveform (10). Each time that the first signal is provided, a measuring pulse (24) that is different in duration than the sensed waveform (10) is provided. The sensed waveform (10) and the measuring pulse (24) are simultaneously transmitted to a gate (28) which provides a signal at its output to indicate if the frequency of the sensed waveform has varied more than a predetermined amount.

1 Claim, 4 Drawing Figures

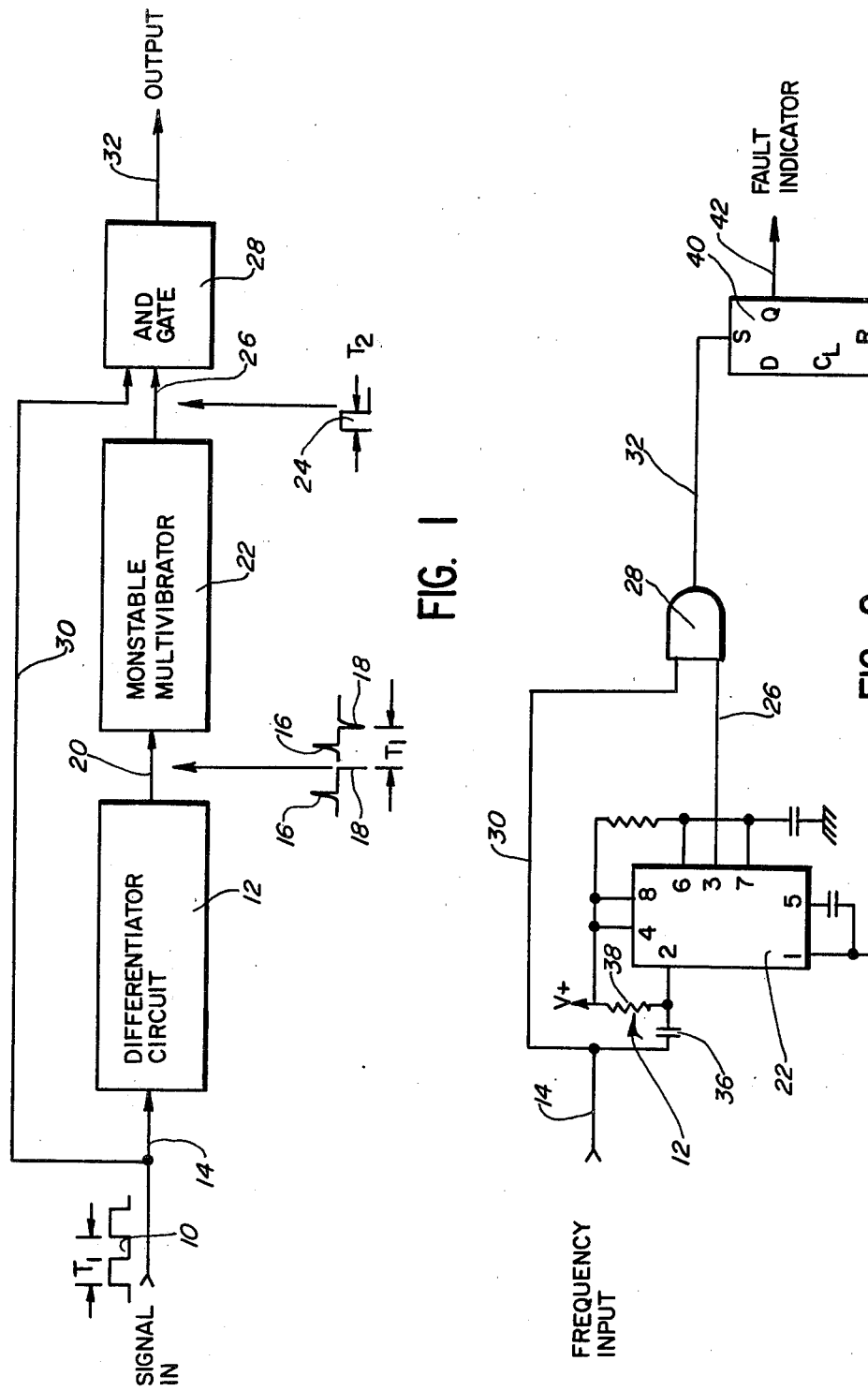

PROCESS AND DEVICE FOR DETECTING FREQUENCY VARIATIONS

TECHNICAL FIELD

The present invention concerns a process and a device for detecting variations in the frequency of waveforms. The present invention is particularly useful for detecting whether the frequency of a waveform is greater or less than a predetermined amount.

BACKGROUND ART

In a copending U.S. patent application filed in the names of Michael F. Wicnienski and Donald E. Charles, entitled "Dosimeter For Photometric Applications", Ser. No. 389,430, filed June 17, 1982, there is disclosed a dosimeter which could be used in a germicidal chamber, for determining the amount of ultraviolet irradiation that has been received. The dosimeter disclosed in the aforementioned patent application includes a voltage or current to frequency converter which provides having a frequency that is proportional to the amplitude of the input voltage or current. If the voltage or current to frequency converter happens to fail in a manner such as to generate an abnormally high output frequency, the dosimeter could perceive that the dose of irradiation has occurred although there has actually been provided an unsafe, foreshortened dose. Thus when using a dosimeter which incorporates a voltage or current to frequency converted it is important that an abnormally high output frequency of the converter be detected.

There are other systems which depend upon the counting of output pulses from a voltage or current to frequency converter. If such output pulses have a frequency that is below a certain threshold or a frequency that is above a certain threshold, the system may not operate properly and a dangerous condition may be presented. In such systems, it is important that abnormal frequency variations be detected

DISCLOSURE OF THE INVENTION

In accordance with the present invention, a process for detecting frequency variations is provided. The process includes the steps of sensing a waveform, the frequency variation of which is to be detected. A first signal is provided with each occurrence of the sensed waveform. A measuring pulse, different in duration than the sensed waveform, is provided each time that the signal is provided. The sensed waveform and the measuring pulse are simultaneously transmitted to a gate. A signal is provided at the output of the gate to indicate if the frequency of the sensed waveform has varied more than a predetermined amount.

In the illustrative embodiment, the sensed waveform is a rectangular wave and the first signal is a spike corresponding to the negative transition of the rectangular wave. The measuring pulse is a rectangular pulse which is initiated upon occurrence of the spike and is shorter in duration than the negative portion of the sensed waveform. The gate is an AND gate which receives the sensed wave at one input and the measuring rectangular pulse at another input. The gate output signal is a train of pulses indicating that the frequency of the sensed wave is greater than a predetermined amount.

In the illustrative embodiment, the first signal is provided by means of a differentiator circuit and the measuring pulse is provided by means of a monostable multivibrator which initiates a rectangular pulse upon occurrence of the first signal.

A more detailed explanation of the invention is provided in the following description and claims, and is illustrated in the accompanying drawings.

BRIEF DESCRIPTION OF DRAWINGS

FIG. 1 is a block diagram of a device for detecting frequency variations of waveforms, constructed in accordance with the principles of the present invention.

FIG. 2 is a schematic circuit diagram thereof.

DETAILED DESCRIPTION OF THE ILLUSTRATIVE EMBODIMENT

Figure 4:
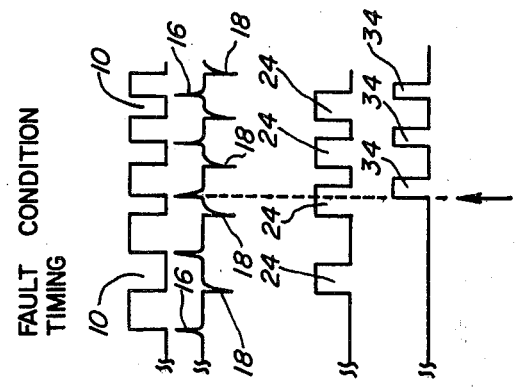
FIG. 4 is a timing-waveform chart showing the waveforms when a false condition occurs.

Referring to FIG. 1, the input waveform to be sensed is a rectangular of square waveform 10 having a duration $T_1$. Waveform 10 is fed to a differentiator circuit via line 14 to differentiate waveform 10, forming positive spikes 16 which correspond to the rising edges of waveform 10 and negative spikes 18 which correspond to the falling edges of the waveform 10.

The differentiated waveform is fed via line 20 to a monostable multivibrator 22 which provides a positive going output pulse 24 having a time duration $T_2$ which is less than the low portion of the rectangular waveform 10. In the illustrative embodiment, monostable multivibrator 22 is a type which operates to provide an output pulse only upon receipt of negative spikes 18.

Pulse 24 is applied via line 26 to one input of an AND gate 28, and waveform 10 is applied via line 30 to another input of AND gate 28. The output of AND gate 28 on line 32 can be ascertained by referring to FIGS. 3 and 4.

Figure 3:
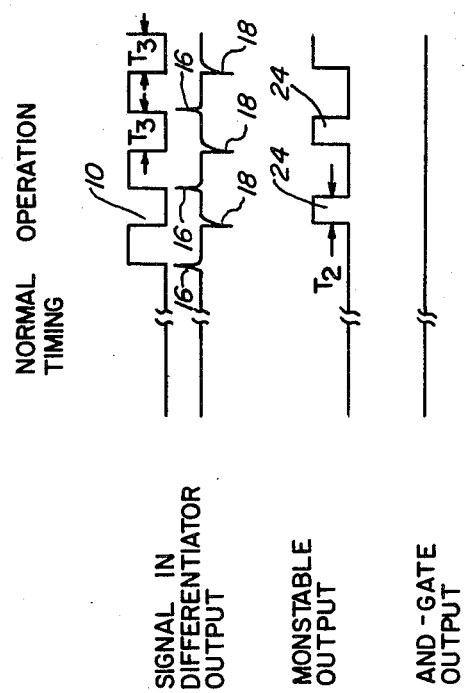
FIG. 3 is a timing-waveform chart showing the waveforms during normal operation.

Referring to FIG. 3, if waveform 10 is operating normally there will be no output pulses on line 32 because the low going portions $T_3$ of waveform 10 remain greater in duration than $T_2$ of pulses 24. Thus at no time are both of the inputs to gate 28 high and there is no output signal on line 32.

On the other hand, if the frequency of waveform 10 increases, the duration of the low going portions of waveform 10 will decrease. Referring to FIG. 4, it can be seen that once the frequency of waveform 10 increases to a predetermined amount, there will be high signals at both inputs of AND gate 28 and a train of output pulses 34 will result. The predetermined amount or threshold frequency at which there will be pulses on line 34 occurs when $T_3$ is less than $T_2$. Thus $T_2$ is selected so as to provide a threshold wherein any frequency of the input waveform above this threshold will provide output pulses on line 32 indicating a fault.

Referring to FIG. 2, it can be seen that the input waveform to be sensed is fed via line 14 to differentiating circuit 12 which comprises a capacitor 36 and resistor 38. The differentiated sensed waveform is fed to a monostable multivibrator which, in the illustrative embodiment, comprises a commercially available 555 timer integrated circuit. Output pulses 24 from monostable multivibrator 22 are fed to one input of AND gate 28 via line 26 and the sensed input waveform is fed via line 30 to the other input of AND gate 28. The output signal on line 32 is used to set a flip-flop 40 which feeds a signal via line 42 to a fault indicator.

If the output on line 32 is low as indicated in FIG. 3, flip-flop 40 will not be set and there will be no fault indicated. However, if a pulse occurs on line 32, flip-flop 40 will become set to provide a signal for indicating a fault.

Although an illustrative embodiment of the invention has been shown and described, it is to be understood that various modifications and substitutions may be made by those skilled in the art without departing from the novel spirit and scope of the present invention.

What is claimed is:

1. A device for detecting frequency variations which comprises:

means for sensing a rectangular waveform, the frequency variation of which is to be detected;

a differentiator circuit for providing a spike corresponding to each occurrence of the negative transition of the sensed rectangular waveform;

a monostable multivibrator for initiating a rectangular measuring pulse upon each occurrence of said spike, said measuring pulse being different in duration than the low portion of the sensed waveform;

an AND gate;

means for transmitting the sensed waveform to one input of the AND gate and for transmitting the measuring pulse to another input of the AND gate;

said AND gate being operable for providing a train of pulses at its output indicating that the frequency of the sensed rectangular wave has varied by more than a predetermined amount.

* * * * *